United States Patent [19]

Johnson et al.

[11] Patent Number: 5,025,306
[45] Date of Patent: Jun. 18, 1991

[54] ASSEMBLY OF SEMICONDUCTOR CHIPS

[75] Inventors: Randall E. Johnson, Carrollton; James M. Drumm, Dallas, both of Tex.

[73] Assignee: Texas Instruments Incorporated, Dallas, Tex.

[21] Appl. No.: 230,203

[22] Filed: Aug. 9, 1988

[51] Int. Cl.$^5$ ............................................. H01L 25/10
[52] U.S. Cl. .................................... 357/75; 361/392; 361/395; 361/414; 361/417
[58] Field of Search .................... 357/40, 55, 74, 75, 357/84; 361/392, 395, 414, 417

[56] References Cited

U.S. PATENT DOCUMENTS

| | | | |
|---|---|---|---|
| 2,913,632 | 11/1959 | Stanton | 357/40 X |
| 3,312,871 | 4/1967 | Seki et al. | 357/40 X |
| 3,372,310 | 3/1968 | Kantor | 361/392 |
| 3,402,331 | 9/1968 | Rittner | 357/40 X |
| 3,430,104 | 2/1969 | Burgess et al. | 357/40 X |
| 3,436,604 | 4/1969 | Hyltin et al. | 357/40 |
| 3,441,805 | 4/1969 | Paulson | 361/392 X |
| 3,462,317 | 8/1969 | Baum et al. | 357/40 X |
| 3,507,766 | 4/1970 | Cunningham et al. | 357/40 X |
| 3,581,385 | 6/1971 | Lathrop | 357/40 X |
| 3,585,712 | 6/1971 | Boncuk | 357/40 X |
| 3,604,989 | 9/1971 | Haneta et al. | 357/40 X |
| 3,606,679 | 9/1971 | Schroeder | 357/40 X |
| 3,613,226 | 10/1971 | Haisty et al. | 357/40 X |
| 3,634,731 | 1/1972 | Skogmo | 357/75 X |
| 3,643,232 | 2/1972 | Kilby | 357/55 X |
| 3,681,134 | 8/1972 | Nathanson et al. | 357/40 X |
| 3,754,170 | 8/1973 | Tsuda et al. | 357/40 |
| 3,771,217 | 11/1973 | Hartman | 357/40 X |
| 3,851,221 | 11/1974 | Beaulieu et al. | 361/392 X |
| 3,949,274 | 4/1976 | Anacker | 361/392 X |
| 4,237,522 | 12/1980 | Thompson | 361/392 |
| 4,525,921 | 7/1985 | Carson et al. | 437/208 |
| 4,646,128 | 2/1987 | Carson et al. | 357/74 |
| 4,706,166 | 11/1987 | Go | 361/403 |
| 4,730,232 | 3/1988 | Lindberg | 361/392 X |
| 4,730,238 | 3/1988 | Cook | 361/392 X |
| 4,801,992 | 1/1989 | Golubic | 357/40 |

FOREIGN PATENT DOCUMENTS 2515876  5/1983  France ............................... 361/392

OTHER PUBLICATIONS

Jarvela et al., "Stacked High-Density Multichip Module", *IBM Technical Disclosure Bulletin*, (vol. 14, No. 10; 3/72; pp. 2896-2897).

Primary Examiner—Thomas H. Tarcza
Assistant Examiner—Bernarr Earl Gregory
Attorney, Agent, or Firm—Gary C. Honeycutt; Melvin Sharp; N. Rhys Merrett

[57] ABSTRACT

A three dimensional package having at least one semiconductor chip having input/output conductive pads along its periphery includes a dielectric carrier over at least a portion of the chip and a plurality of conductors mounted on the carrier between the chip and the dielectric carrier. The plurality of conductors are mounted within the periphery of the chip with one end connected to the conductive pads and with the other end of the plurality of conductors exiting from the same side of the chip. The plurality of conductors exiting from the same side are electrically coupled to an interconnect substrate.

10 Claims, 7 Drawing Sheets

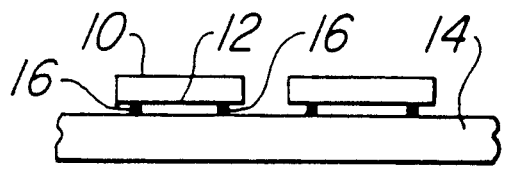 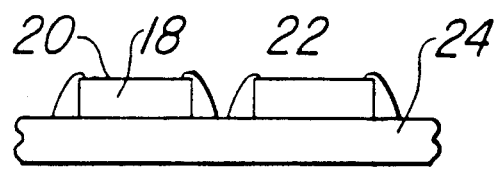
Fig. 1a PRIOR ART        Fig. 1b PRIOR ART
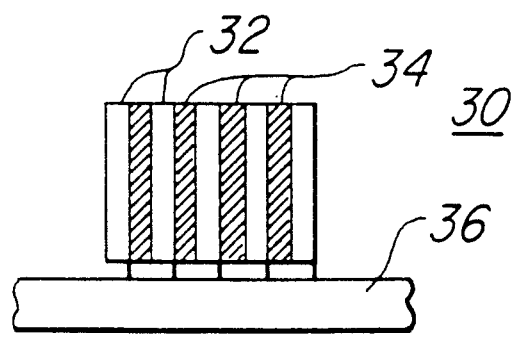
Fig. 2

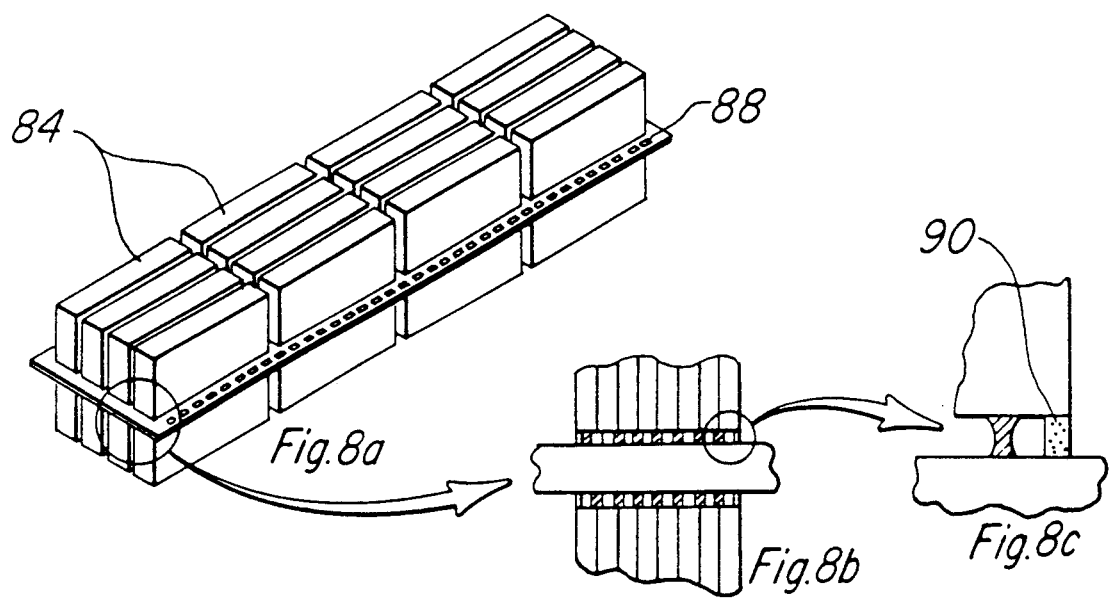
Fig. 8a
Fig. 8b
Fig. 8c
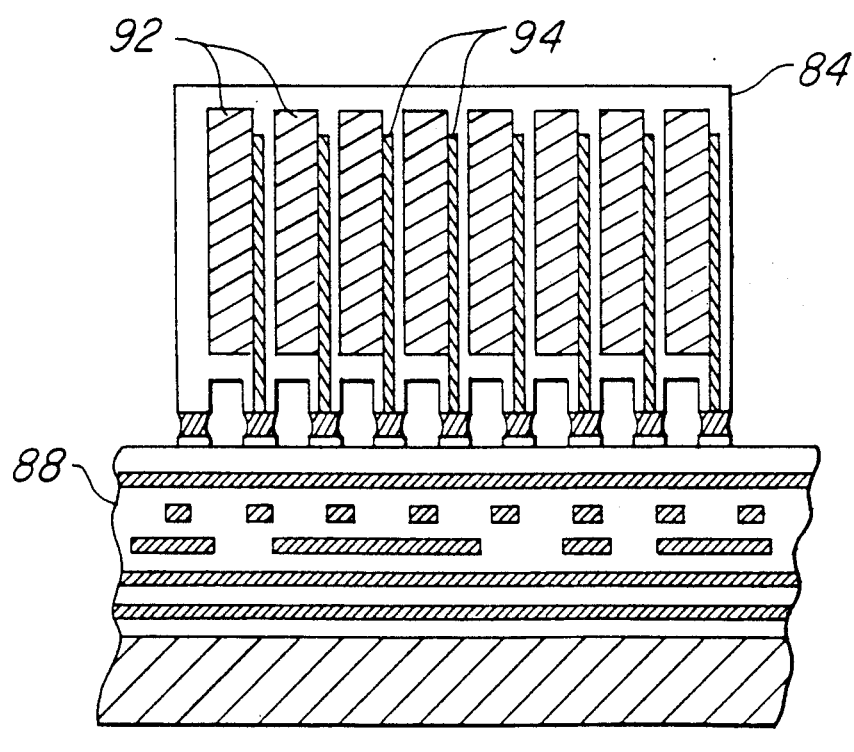
Fig. 9

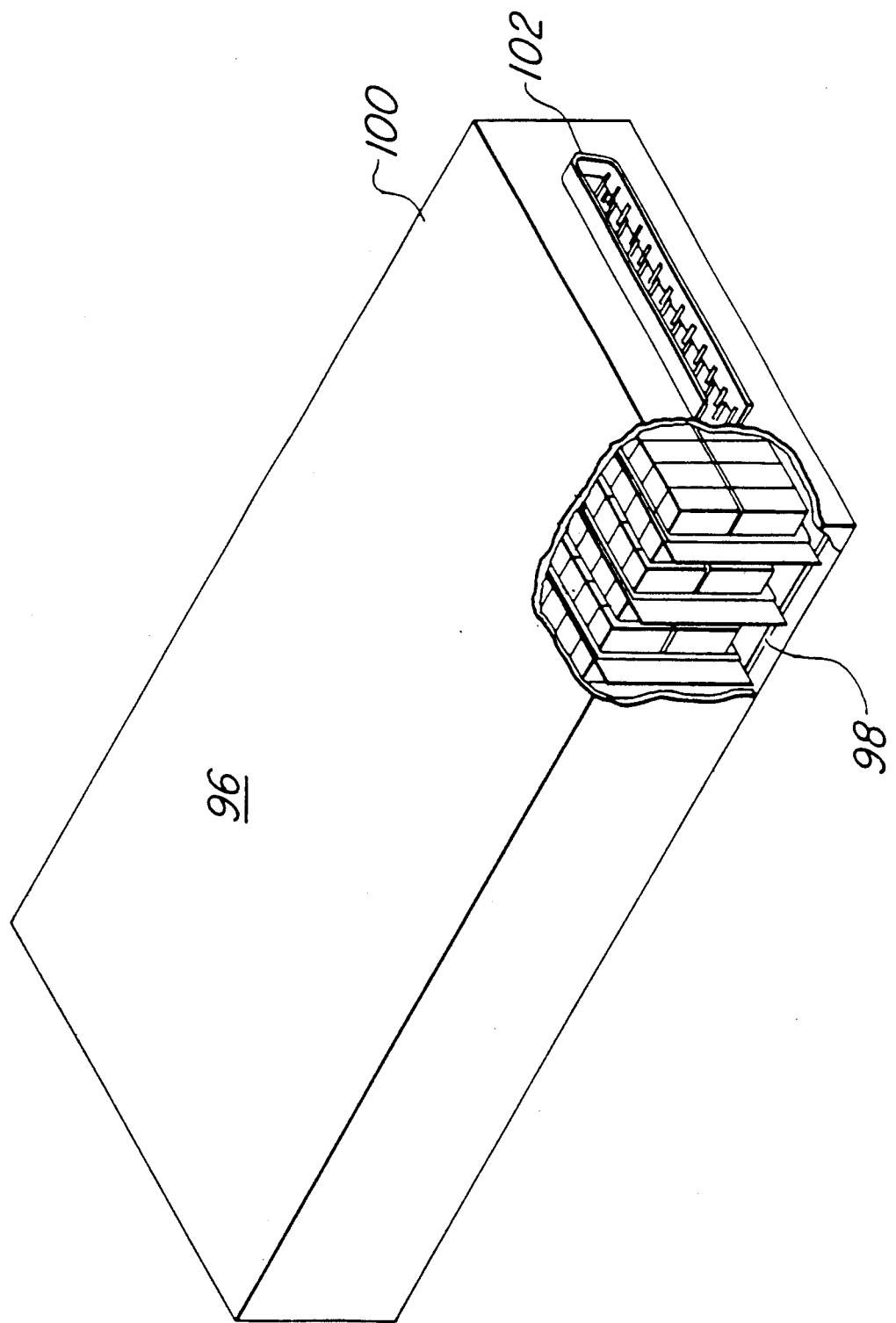

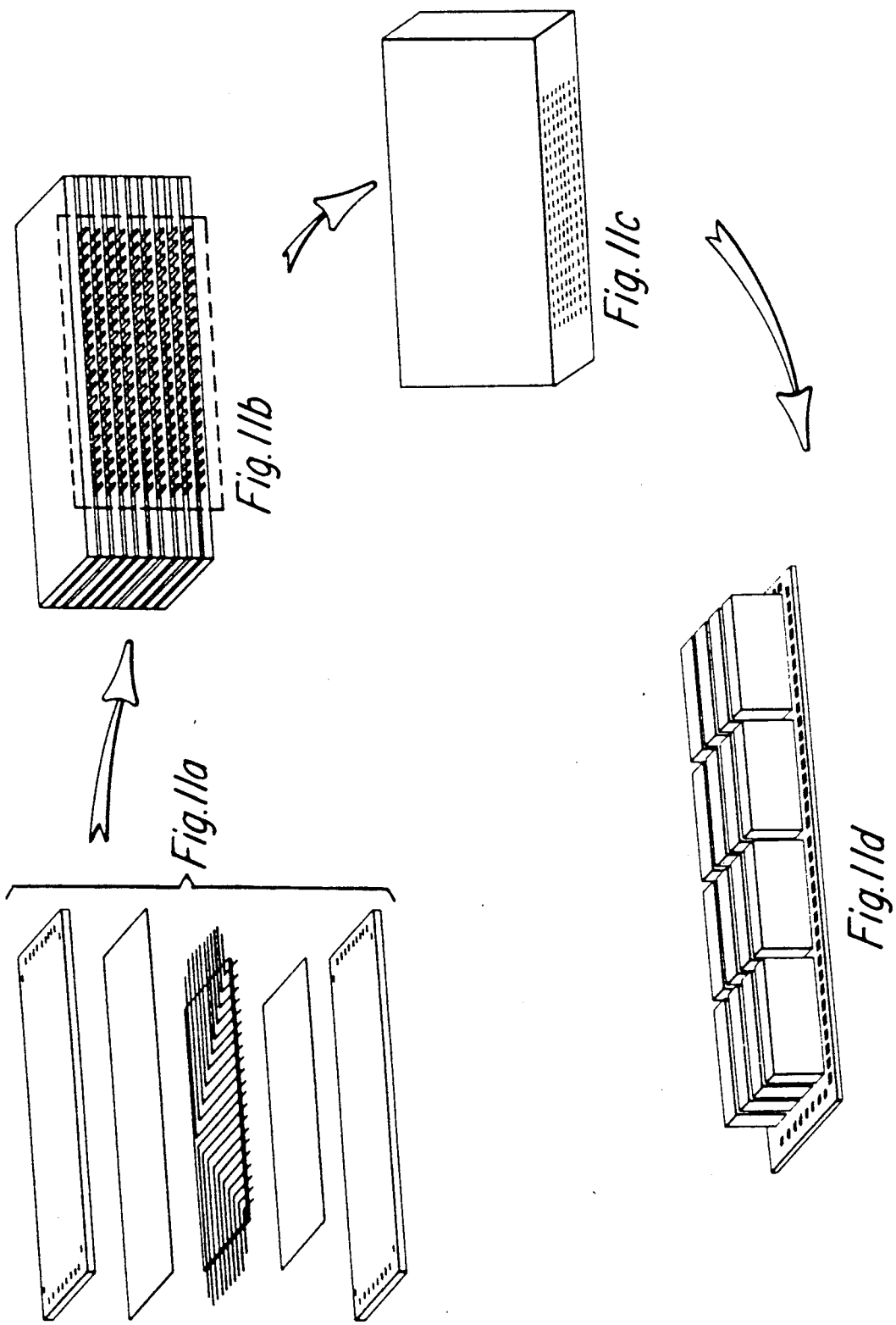

ASSEMBLY OF SEMICONDUCTOR CHIPS

This patent application relates to pending patent application Ser. No. 229,685, filed Aug. 8, 1988 entitled "General Three Dimensional Packaging" (TI-13029).

This invention relates to packaging, and, more particularly to a method and apparatus for achieving high density, three dimensional packaging of semiconductors.

Military and commercial systems today are placing increasing requirements on packaging density and efficiency. As applied to memory devices, for example, these requirements often are amplified due to the large number of devices necessary for system operation.

Prior art packaging systems contemplate placing a plurality of memories on a printed circuit board in a planar manner or the hybridization of memories (placing more than one chip in a package). This has been implemented using wire bond, tape automated bonding (TAB) and flip chips to access the electrical input/output (I/O) pads on the chip. Significant increases in packaging density are not possible through hybridization.

Accordingly it is an object of the present invention to provide a method and system for interconnecting semiconductor (S/C) chips in a three dimensional (3D) configuration to allow high density packaging.

Another object of the present invention is to provide a method and system for interconnecting a plurality of 3D packages on an interconnect substrate which reduces the interconnect substrate area required and enhances the electrical performance.

Another object of the present invention is to develop an efficient, economical, mass producible technology for the very dense packaging of semiconductor chips.

Another object of the present invention is to provide a 3D packaging technology based on orthogonal assembly of tape automated bonded (TAB) semiconductor chips.

Other objects and features of the invention will become more readily understood from the following detailed description and appended claims when read in conjunction with the accompanying drawings, in which like reference numerals designate like parts throughout the figures thereof, and in which:

FIGS. 1A and 1B illustrate a prior art packaging arrangement.

FIG. 2 illustrates a 3D packaging arrangement according to the present invention.

FIG. 8 illustrates a plurality of 3D packages attached to a daughterboard and an exploded view of a solder joint.

FIG. 9 illustrates a cross-sectional enlargement of one of the 3D packages and daughterboard of FIG. 8.

FIG. 10 illustrates a system package which includes a plurality of daughterboards shown in FIG. 9.

FIG. 11 illustrates the packaging steps required to fabricate a 3D package according to the present invention.

Figure 3:
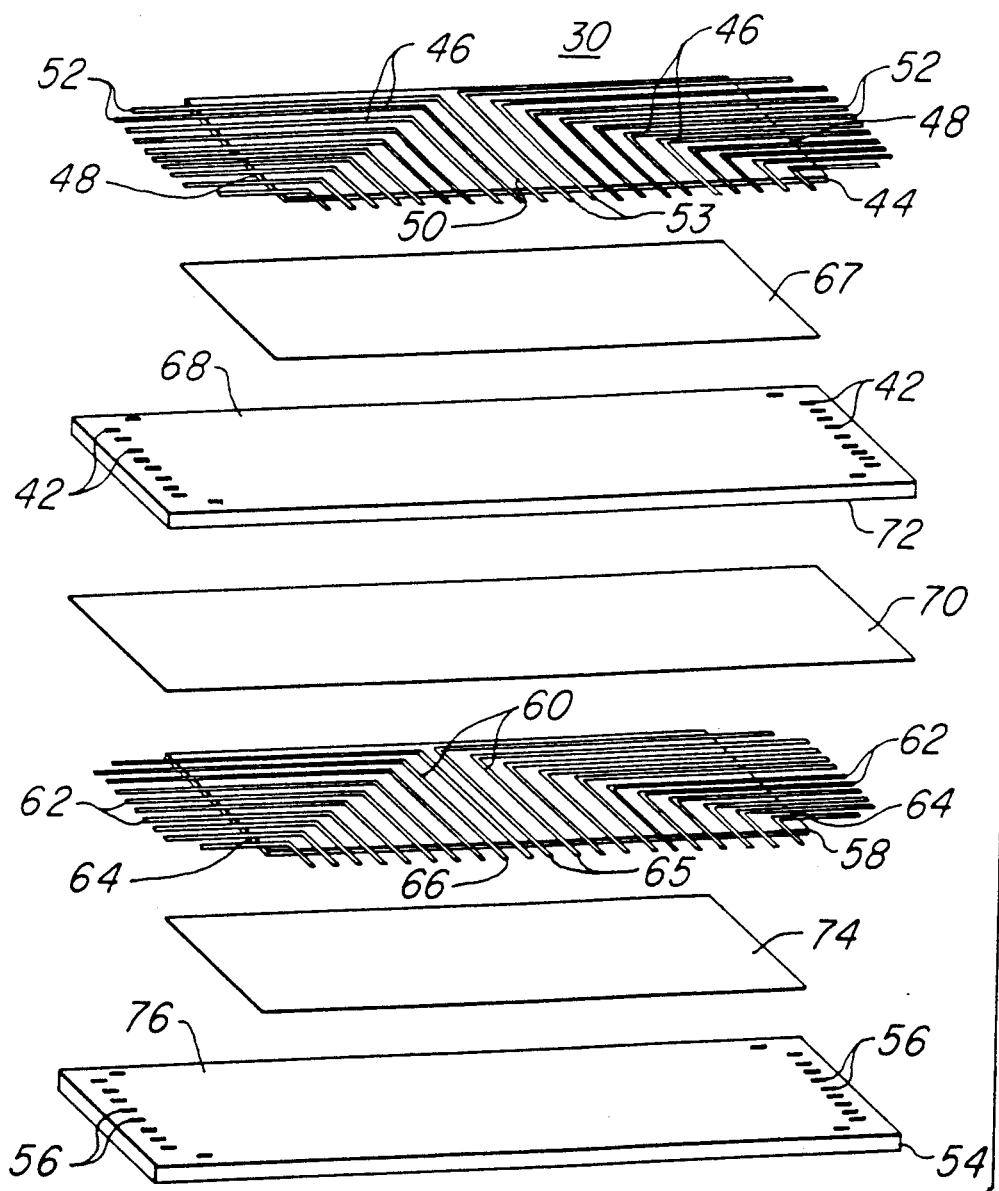
FIG. 3 illustrates an exploded view of the 3D package shown in FIG. 2.

Referring now to FIG. 1A, there is illustrated a prior art semiconductor chip 10 having its active surface 12 in proximity to an interconnect substrate 14. In FIG. 1A semiconductor chip 10 is a flip chip memory which interconnects to substrate 14 through electrical connections 16.

In similar matter, it can be seen in the prior art embodiment of FIG. 1B that semiconductor chip 18 has its active surface 20 facing away from substrate 24, and, therefore conductors 22 are used to electrically interconnect the active surface 20 of chip 18 with the interconnect substrate 24. As can be seen in both prior art embodiments of FIGS. 1A and 1B, the active surfaces 12 and 20 are restricted to a single plane parallel to substrates 14 and 24, respectively, and thereby overlays a large portion of the interconnect substrate, resulting in lower package densities.

Referring now to FIG. 2 there is illustrated a three dimensional (3D) package 30 constructed according to the present invention which is based on the stacking of S/C chips 32 while accessing the electrical I/O pads on chips 32 with a tape automated bonding lead frame 34. Through stacking of the S/C chips 32, the active surfaces of the interconnected chips 32 are no longer restricted to a single plane (as illustrated in FIGS. 1A and 1B) with respect to the interconnect substrate 36. This approach results in a 45-1 increase in packaging over the best of hybridized surface mount and a 285-1 increase over dual-in-line (DIP) technology. A more detailed explanation of the invention follows.

FIG. 3 illustrates an exploded view of the 3D package 30 illustrated in FIG. 2. A first semiconductor chip 40, for example, a 256K DRAM memory chip, has electrical contact pads 42 along its periphery. A first dielectric carrier 44 overlays at least a portion of chip 40 and may be made of a polymide tape or polyester, by way of example. A plurality of first conductors 46 are mounted to the first dielectric carrier 44 and extend past edges 48 and edge 50. The ends 52 of conductors 46 are electrically connected, for example, by thermal compression bonding, to electrical I/O pads 42 on the first S/C chip 40. The other ends 53 extend past edge 50 and exit from the same side of the package.

In a similar manner in FIG. 3, a second semiconductor chip 54 is in alignment with the first semiconductor chip 40 and has electrical conductive I/O pads 56 located along its periphery. A second dielectric carrier 58 has a second plurality of conductors 60 mounted thereto, the ends 62 of which extend past the edge 64 of the carrier 58. The other ends 65 of conductor 60 extend past the edge 66 of carrier 58. The ends 62 of conductor 60 are electrically connected to the I/O pads 56 of chip 54. The other ends 53 of conductors 46 on carrier 44 exit in the same direction as the conductor ends 65 of conductor 60 on carrier 58. A first dielectric spacer 67 may be interposed between conductors 46 and the active surface 68 of chip 40. Dielectric spacer 67 may be an adhesive which is thermally conductive, an epoxy, or may be an air space. In like manner, a second dielectric spacer 70 may be positioned between the non-active surface 72 and the second dielectric carrier 58 and conductors 60. A third dielectric spacer 74 may be positioned between the active surface 76 of chip 54 and the conductors 60 on dielectric carrier 58.

The configuration illustrated in FIG. 3 may be repeated for a plurality of chips and dielectric carriers/conductors in order to build up a 3D package (such as in FIG. 9, hereinafter described). It will be noted that the routing of conductors 46 and 60 on dielectric carriers 44 and 58, respectively, will produce the signals present on pads 42 and 56 on a single side of the 3D package 30.

Figure 4:
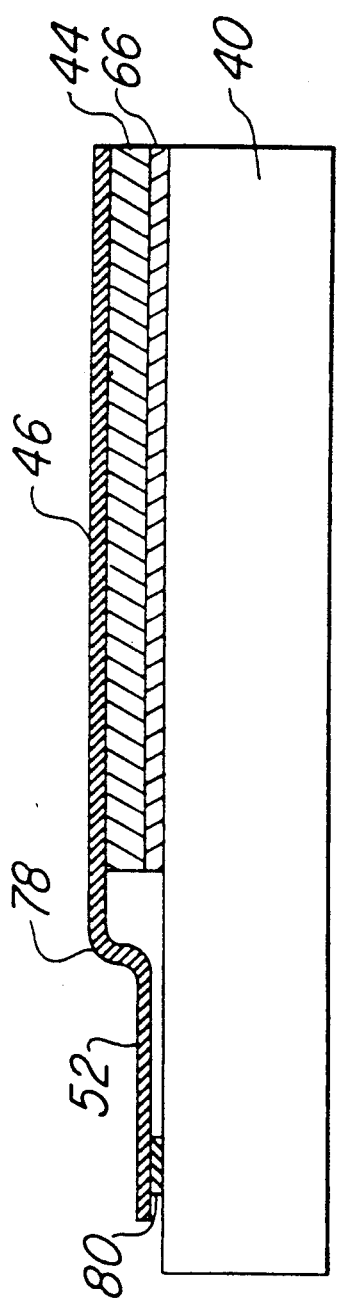
FIG. 4 illustrates a method to interconnect the carrier/conductors to the electrical pads on the semiconductor chip.

FIG. 4 illustrates a "conductor down" configuration to mate the carrier 44/conductors 46 with the chip 40. In FIG. 4A, conductors 46 are "down" or underneath the dielectric spacer 44. Conductors 46 are sandwiched between carrier 44 and a dielectric spacer 66, which, as mentioned above, may be epoxy or an adhesive. Dielectric carrier 44 may be a polymide tape. Electrical bumps 80 are formed over pads 42 (shown in FIG. 3); these bumps may be formed of gold and are electrically connected to conductor ends 52 by thermal compressive bonding, by way of example. Conductors 46 may be formed of gold plated copper.

Figure 5:
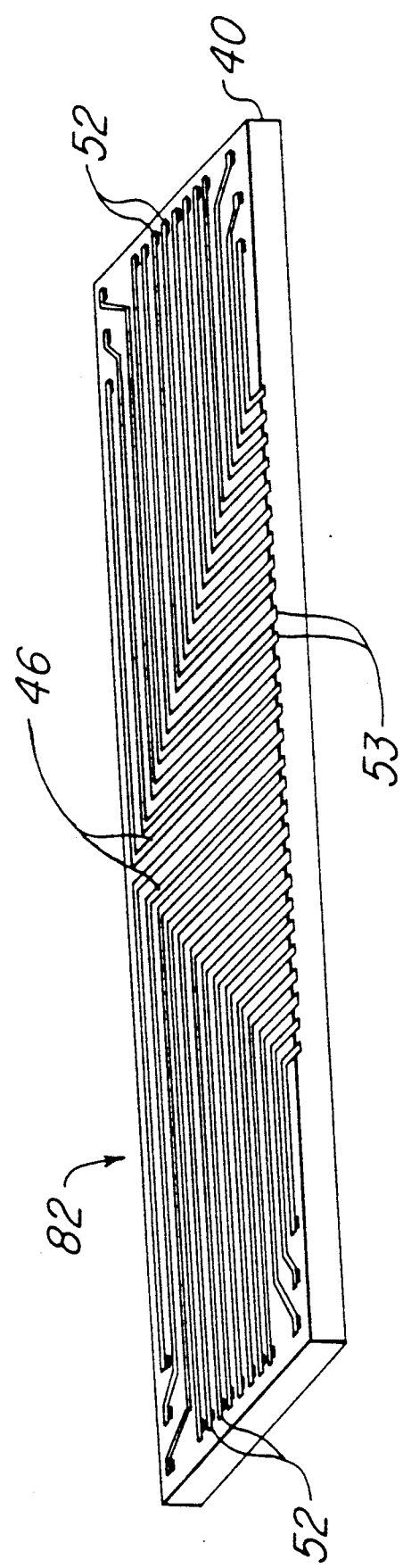
FIG. 5 illustrates the completed basic building block of the 3D packaging arrangement according to the present invention.
Figure 6:
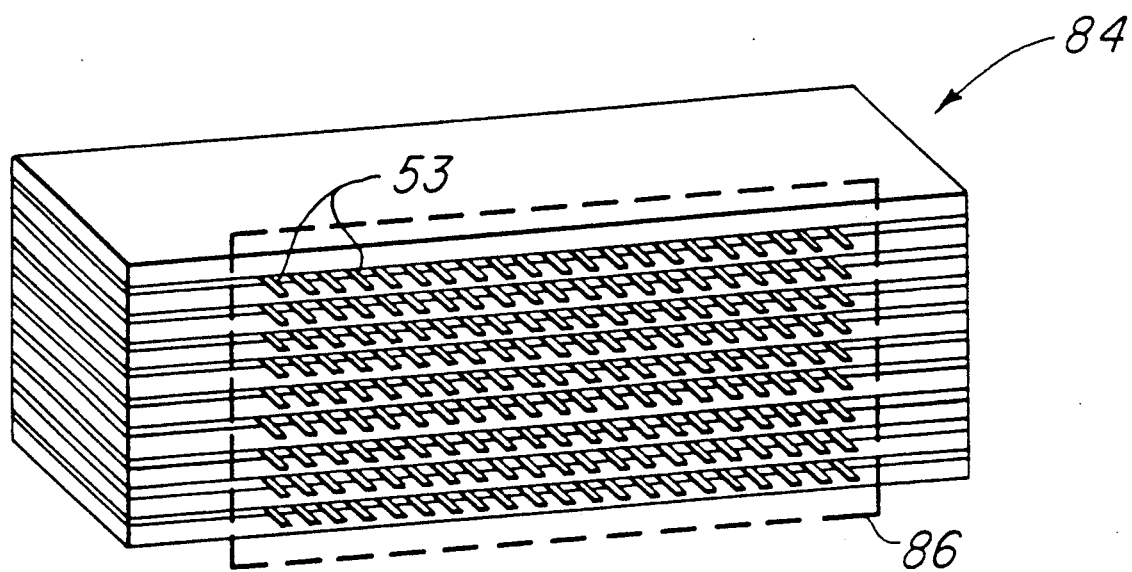
FIG. 6 illustrates a plurality of the building blocks shown in FIG. 5 stacked in a laminated package.

FIG. 5 illustrates a semiconductor chip 40, which has been pretested on TAB tape to enhance assembly yield, after the ends 52 of conductors 46 have been bonded to bumps 80 (as shown in FIGS. 4A and 4B) and after the ends 52 and 53 have been cut or excised. The structure of FIG. 5 represents the basic building block 82 of the 3D packaging system. A plurality of these building blocks 82 are laminated together with, for example, a thermally conductive adhesive, such as dielectric spacer 70 in FIG. 3, to form a 3D package 84 as illustrated in FIG. 6. When the building blocks 82 (FIG. 5) are laminated together, the leads 53 on dielectric carrier 44 form an array 86 on a single side of the 3D package 84 as shown in FIG. 6. It will be recognized that one or more of these basic building blocks could be orthogonally attached to a substrate (as shown in FIG. 2) without an adhesive therebetween.

Figure 7B:
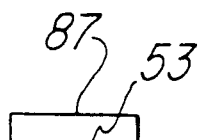
FIG. 7 illustrates the laminated package of FIG. 6 after encapsulation and polishing.
Figure 7A:
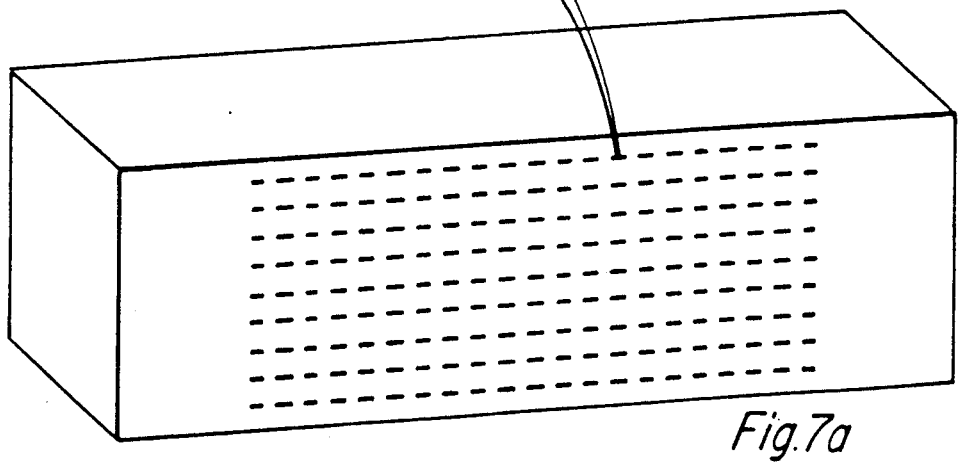

Referring now to FIG. 7, the laminated package 84 (of FIG. 6) is then encapsulated in a potting compound such as epoxy and polished to expose the cross section of conductor ends 53. Additionally, the cross section of end conductors 53 may be enlarged as shown in the insert in FIG. 7 by, for example, depositing conductor metal over the entire surface and then substrative definition by etching or milling; alternatively, the cross section of conductors 53 may be enlarged through an additive process, such as depositing metal through a shadow mask. The insert of FIG. 7 illustrates the resulting enlarged pad 87 of conductor end 53. The resulting metal may be chrome with copper deposited thereover for enhanced solderability. This provides a larger pad 87 for better mechanical and electrical connection to an interconnect substrate.

FIG. 8 illustrates a plurality of 3D chip packages 84 mounted on a dielectric carrier or interconnect substrate, such as daughterboard 88. Solder bumps (not shown) are formed on motherboard 88 to correspond with each of the exposed leads emanating from packages 84. The height of the solder bumps can be controlled with standoff spacers 90 in order to ensure optimum solder joint height for maximum reliability.

FIG. 9 shows a cross-section enlargement of 3D chip package 84 and daughterboard 88 illustrated in FIG. 8. For purposes of illustration, 3D chip package 84 has eight individual S/C chips 92 encapsulated therein and electrical conductors 94 exit from package 84 on the same side to interconnect through the solder joints to daughterboard 88. As illustrated in FIG. 9, daughterboard 88 includes multilayers of conductors and insulator material to allow various signals, such as power, ground, x and y-axis signals, to exist therein.

FIG. 10 illustrates a system package 96 which includes a plurality of daughterboards 88 (individually shown in FIG. 8) which are interconnected by way of motherboard 98. The motherboard is then positioned in an enclosure 100 and the electrical signals input to and output from the motherboard 98 are coupled through connector 102.

FIG. 11 illustrates the packaging steps required to fabricate a 3D chip package according to the present invention. As can be seen from FIG. 11, a plurality of chips are laminated together with adhesive and a dielectric carrier having a plurality of conductors mounted thereon all of which exit from the same side. There are then assembled into a chip stack, the chip is encapsulated and polished and then interconnected to a daughterboard. A plurality of these daughterboards are then interconnected to a motherboard (as shown in FIG. 10).

Although the present invention has been shown and illustrated in terms of a specific method and apparatus, it will be apparent that changes or modifications can be made without departing from the spirit and scope of the invention as defined by the appended claims.

What is claimed is:

1. A three dimensional circuit package comprising:
   a first semiconductor circuit chip having pads on its periphery;
   a first dielectric carrier over at least a portion of said first chip;
   a first plurality of conductors positioned on the carrier between said first chip and said carrier, substantially within the periphery of said chip, one end of each conductor connected to a chip pad, and the other end of each connector extending beyond a single edge of said chip; and
   an interconnect substrate having a plurality of conductive means thereon electrically interconnected with the ends of said first plurality of conductors that extend beyond said edge of the chip.

2. A package according to claim 1 wherein said first chip and said interconnect substrate are orthogonal.

3. A three dimensional circuit package comprising:
   a first semiconductor circuit chip having pads on its periphery;
   a first dielectric carrier over at least a portion of said first chip;
   a first plurality of conductors positioned on the carrier between said first chip and said first carrier, substantially within the periphery of said first chip, one end of each conductor connected to a chip pad, and the other end of each connector extending beyond a single edge of said first chip;
   a second semiconductor circuit chip having second pads on its periphery;
   a second dielectric carrier over at least a portion of said second chip;
   a second plurality of conductors mounted on the second carrier between said second chip and said second carrier, substantially within the periphery of said second chip, one end of each of said second conductors connected to said second pads, and the other end of each of said second conductors extending beyond the same edge of said second chip as the corresponding edge of said first chip; and an interconnect substrate having a plurality of conductive means thereon electrically interconnected with said first and second plurality of conductor ends that extend beyond the end of said first and second chips, respectively.

4. A package according to claim 3 further including a first dielectric spacer positioned between said first chip and said first plurality of conductors.

5. A package according to claim 4 wherein said dielectric spacer is an adhesive layer.

6. A package according to claim 4 further including a second dielectric spacer positioned between said second chip and said second plurality of conductors.

7. A package according to claim 6 wherein said dielectric spacer is an adhesive layer.

8. A package according to claim 6 further including a third dielectric spacer between said first chip and said second dielectric carrier.

9. A package according to claim 3 wherein said first and second chips and said interconnect substrate are orthogonal.

10. A package according to claim 3 further including encapsulation surround said package.

* * * * *

UNITED STATES PATENT AND TRADEMARK OFFICE
CERTIFICATE OF CORRECTION

PATENT NO. : 5,025,306

DATED : June 18, 1991

INVENTOR(S) : Randall E. Johnso, James M. Drumm

It is certified that error appears in the above-identified patent and that said Letters Patent is hereby corrected as shown below:

Sheet 3 of the drawings, consisting of Figs. 4 and 5, should be deleted to be replaced with the new sheet of drawings consisting of Figs. 4 and 5, as shown on the attached page.

Signed and Sealed this

Eighth Day of December, 1992

Attest:

DOUGLAS B. COMER

Attesting Officer

Acting Commissioner of Patents and Trademarks

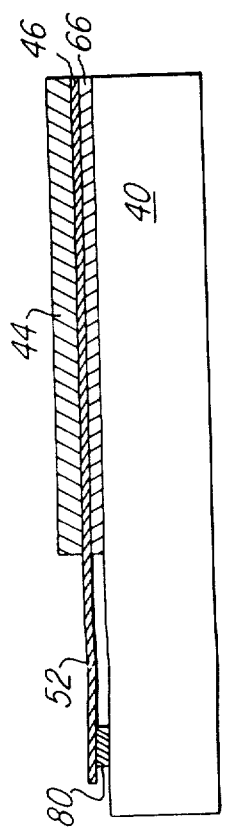
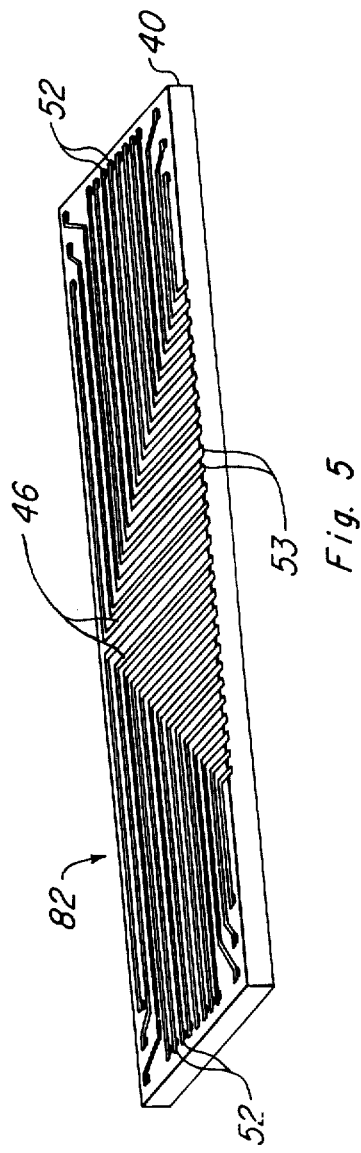
Fig. 4
Fig. 5